(12) United States Patent
Dewey et al.

(10) Patent No.: US 11,380,797 B2
(45) Date of Patent: Jul. 5, 2022

(54) THIN FILM CORE-SHELL FIN AND NANOWIRE TRANSISTORS

(71) Applicant: Intel Corporation, Santa Clara, CA (US)

(72) Inventors: Gilbert Dewey, Hillsboro, OR (US); Van H. Le, Portland, OR (US); Abhishek A. Sharma, Hillsboro, OR (US); Shriram Shivaraman, Hillsboro, OR (US); Ravi Pillarisetty, Portland, OR (US); Tahir Ghani, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 71 days.

(21) Appl. No.: 16/604,146

(22) PCT Filed: Jun. 20, 2017

(86) PCT No.: PCT/US2017/038385
§ 371 (c)(1),
(2) Date: Oct. 9, 2019

(87) PCT Pub. No.: WO2018/236359
PCT Pub. Date: Dec. 27, 2018

(65) Prior Publication Data
US 2020/0127142 A1   Apr. 23, 2020

(51) Int. Cl.
H01L 29/778   (2006.01)
H01L 29/786   (2006.01)
(Continued)

(52) U.S. Cl.
CPC .... H01L 29/78645 (2013.01); H01L 27/1225 (2013.01); H01L 29/0669 (2013.01); H01L 29/22 (2013.01); H01L 29/41791 (2013.01)

(58) Field of Classification Search
CPC ............ H01L 29/7869; H01L 27/1225; H01L 29/785; H01L 29/66795; H01L 29/42392
See application file for complete search history.

(56) References Cited

U.S. PATENT DOCUMENTS 10,510,871 B1 * 12/2019 More ................ H01L 21/02603
2007/0057261 A1   3/2007 Jeong et al.
(Continued)

OTHER PUBLICATIONS

International Search Report and Written Opinion for International Patent Application No. PCT/US2017/038385 dated Feb. 23, 2018, 13 pgs.
(Continued)

Primary Examiner — Bradley Smith
Assistant Examiner — David J Goodwin
(74) Attorney, Agent, or Firm — Schwabe, Williamson & Wyatt, P.C.

(57) ABSTRACT

Thin film core-shell fin and nanowire transistors are described. In an example, an integrated circuit structure includes a fin on an insulator layer above a substrate. The fin has a top and sidewalls. The fin is composed of a first semiconducting oxide material. A second semiconducting oxide material is on the top and sidewalls of the fin. A gate electrode is over a first portion of the second semiconducting oxide material on the top and sidewalls of the fin. A first conductive contact is adjacent the first side of the gate electrode, the first conductive contact over a second portion of the second semiconducting oxide material on the top and sidewalls of the fin. A second conductive contact is adjacent the second side of the gate electrode, the second conductive contact over a third portion of the second semiconducting oxide material on the top and sidewalls of the fin.

24 Claims, 7 Drawing Sheets

(51) Int. Cl.
*H01L 27/12* (2006.01)
*H01L 29/06* (2006.01)
*H01L 29/22* (2006.01)
*H01L 29/417* (2006.01)

(56) References Cited

U.S. PATENT DOCUMENTS

| | | | |
|---|---|---|---|
| 2009/0001415 A1* | 1/2009 | Lindert | H01L 29/66795 |
| | | | 438/164 |
| 2012/0132902 A1 | 5/2012 | Imoto et al. | |
| 2013/0200361 A1 | 8/2013 | Tsang | |
| 2013/0285051 A1 | 10/2013 | Tanaka | |
| 2014/0361293 A1* | 12/2014 | Yamazaki | H01L 29/78696 |
| | | | 257/43 |
| 2015/0108552 A1* | 4/2015 | Yamazaki | H01L 29/78696 |
| | | | 257/288 |
| 2015/0280013 A1* | 10/2015 | Yamazaki | H01L 27/092 |
| | | | 257/43 |
| 2015/0364603 A1 | 12/2015 | Cheng et al. | |

OTHER PUBLICATIONS

International Preliminary Report on Patentability for International Patent Application No., dated Jan. 2, 2020, 10 pages.

* cited by examiner

THIN FILM CORE-SHELL FIN AND NANOWIRE TRANSISTORS

CROSS-REFERENCE TO RELATED APPLICATION

This patent application is a U.S. National Phase Application under 35 U.S.C. § 371 of International Application No. PCT/US2017/038385, filed Jun. 20, 2017, entitled "THIN FILM CORE-SHELL FIN AND NANOWIRE TRANSISTORS," which designates the United States of America, the entire disclosure of which is hereby incorporated by reference in its entirety and for all purposes.

TECHNICAL FIELD

Embodiments of the disclosure are in the field of integrated circuit structures and, in particular, thin film core-shell fin and nanowire transistors.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

The performance of a thin-film transistor (TFT) may depend on a number of factors. For example, the efficiency at which a TFT is able to operate may depend on the sub threshold swing of the TFT, characterizing the amount of change in the gate-source voltage needed to achieve a given change in the drain current. A smaller sub threshold swing enables the TFT to turn off to a lower leakage value when the gate-source voltage drops below the threshold voltage of the TFT. The conventional theoretical lower limit at room temperature for the sub threshold swing of the TFT is 60 millivolts per decade of change in the drain current.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
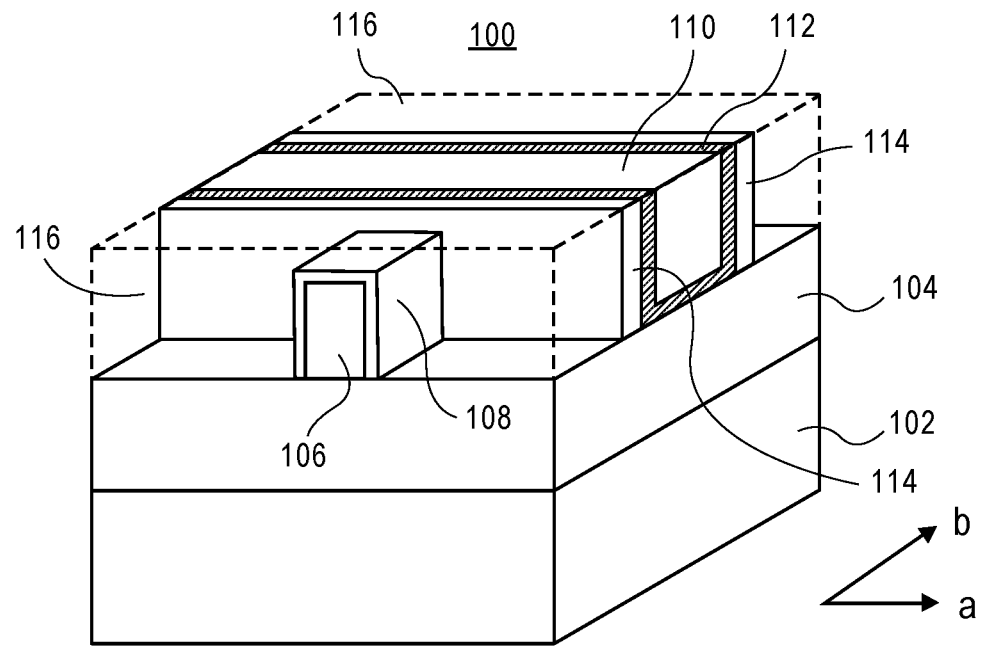
FIGS. 1A, 1B, 1C illustrate angled and direct cross-sectional views of a thin film core-shell fin integrated circuit structure, in accordance with an embodiment of the present disclosure.

Thin film core-shell fin and nanowire transistors are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to BEOL thin film core-shell nanowire transistors for improved stability, mobility, and electrostatics. Embodiments may include or pertain to one or more of back end transistors, IGZO, semiconducting oxide materials, and thin film transistors.

To provide context, for devices based on semiconducting oxides, changes in the oxidation state of the channel material can result in unwanted threshold voltage shifts of the device. State of the art structures include planar or nanowire (or other three-dimensional geometry) devices based on a single thin film transistor (TFT) material fabricated in the BEOL. Typically, such single material mobility regions have stringent passivation requirements and are often sensitive to many downstream temperature processes.

In accordance with one or more embodiments described herein, non-planar BEOL-compatible thin film transistors (TFTs) are fabricated by effectively adding a shell of a second semiconductor material around the channel. Non-planar transistor geometries can include but are not limited to FIN-FET, tri-gate, or gate-all-around (GAA) nanowires. In one embodiment, the addition of a shell around the core fin or wire enables the selection of the shell for increased stability with downstream processing and can encapsulate the core to prevent unwanted voltage threshold (Vt) shifts.

In accordance with one or more embodiments of the present disclosure, the addition of a second thin film semiconductor around a core TFT material can provide one or both of mobility enhancement and/or improved short channel effects (SCEs) particularly if all conduction occurs in the thin shell. The shell (second TFT material) may be selected for strong oxygen bond capability in order to stabilize the TFT when exposed to downstream processing.

In an embodiment, with an inner and outer core non-planar TFT material system, the materials can be independently chosen to maximize mobility, stability, or gate control. For example, some material systems have very high mobility, but are not stable. In accordance with one embodiment, a higher mobility semiconducting oxide material is effectively wrapped in a shell of a lower mobility material semiconducting oxide that is more oxygen stable. The resulting structure may limit the negative effects of downstream high temperature processing operations or aggressive operations on the core of the TFT by having the highly stable shell. An increased set of materials that can be chosen to maximize stability and mobility simultaneously may be achieved using such a dual material architecture.

In accordance with one or more embodiments described herein, some semiconducting oxides are more thermally stable have higher oxygen bonding energy than others. Such semiconducting oxides can withstand higher and longer temperature processing operations without losing oxygen and changing conductivity and threshold voltage. Higher mobility material systems have been demonstrated electrically, but are typically more sensitive to oxidation and temperature processing. A core-shell architecture can exhibit benefits of both high thermal stability and high mobility. A TFT fabricated using such an architecture may exhibit an increase in gate control, stability, and performance of thin film transistors. Applications of such systems may include, but are not limited to, back end (BEOL) logic, memory, or analog applications.

Figure 1B:
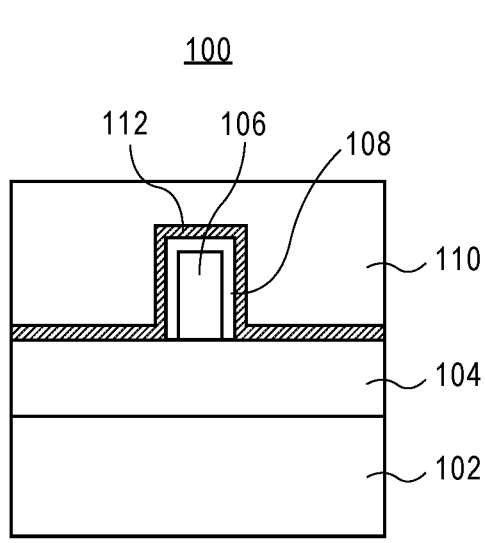
Figure 1C:
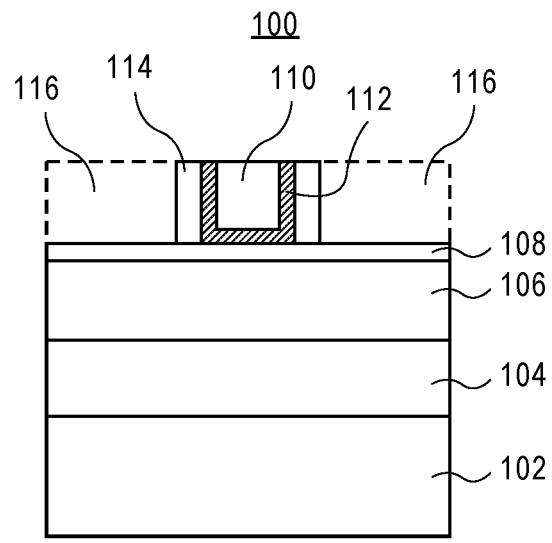

As a first exemplary core-shell structure, FIGS. 1A, 1B, 1C illustrate angled and direct cross-sectional views of a thin film core-shell fin integrated circuit structure, in accordance with an embodiment of the present disclosure.

Referring to FIGS. 1A-1C, an integrated circuit structure 100 includes a fin 106 on an insulator layer 104 above a substrate 102. The fin 106 has a top and sidewalls. The fin 106 is composed of a first semiconducting oxide material. A second semiconducting oxide material 108 is on the top and sidewalls of the fin 106. A gate electrode 110 is over a first portion of the second semiconducting oxide material 108 on the top and sidewalls of the fin 106. The gate electrode 110 has a first side opposite a second side. A first conductive contact (left 116) is adjacent the first side of the gate electrode 110, over a second portion of the second semiconducting oxide material 108 on the top and sidewalls of the fin 106. A second conductive contact (right 116) is adjacent the second side of the gate electrode 110, over a third portion of the second semiconducting oxide material 108 on the top and sidewalls of the fin 106.

In an embodiment, the second semiconducting oxide material 108 has a different composition than the first semiconducting oxide material of fin 106. In one embodiment, the first semiconducting oxide material has a mobility greater than a mobility of the second semiconducting oxide material 108. In one embodiment, the first semiconducting oxide material includes a material such as, but not limited to, tin oxide, antimony oxide, indium oxide, indium tin oxide, titanium oxide, zinc oxide, indium zinc oxide, gallium oxide, titanium oxynitride, ruthenium oxide or tungsten oxide. In one embodiment, the second semiconducting oxide material 108 is or includes indium gallium zinc oxide (IGZO).

In an embodiment, the first and second conductive contacts 116 have a bottom surface substantially co-planar with a bottom of the fin 106, as is depicted in FIG. 1A. In an embodiment, the integrated circuit structure 100 further includes a gate dielectric layer 112 between the gate electrode 110 and the first portion of the second semiconducting oxide material 108 on the top and sidewalls of the fin, as is depicted in FIGS. 1A-1C.

In an embodiment, the integrated circuit structure 100 further includes a first dielectric spacer (left 114) between the first conductive contact 116 and the first side of the gate electrode 110, the first dielectric spacer 114 over a fourth portion of the second semiconducting oxide material 108 on the top and sidewalls of the fin 106. A second dielectric spacer (right 114) is between the second conductive contact 116 and the second side of the gate electrode 110, the second dielectric spacer 114 over a fifth portion of the second semiconducting oxide material 108 on the top and sidewalls of the fin 106, as is depicted in FIGS. 1A and 1C. In one such embodiment, the gate dielectric layer 112 is further along the first and second dielectric spacers 114, as is also depicted in FIGS. 1A and 1C.

Figure 2A:
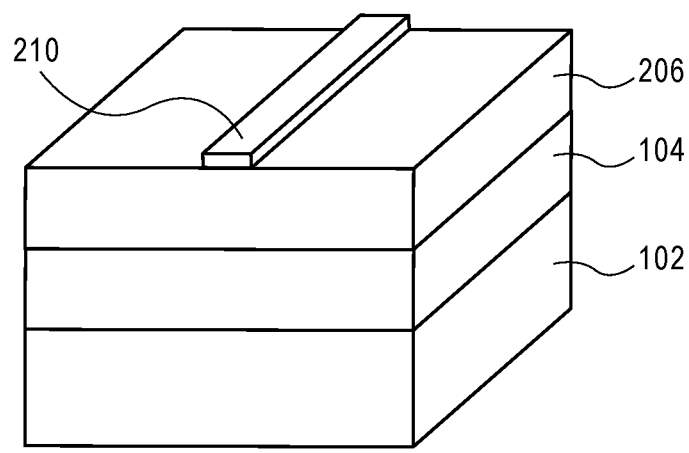
FIGS. 2A-2C illustrate angled cross-sectional views of various stages in a method of fabricating a thin film core-shell fin integrated circuit structure, in accordance with an embodiment of the present disclosure.
Figure 2B:
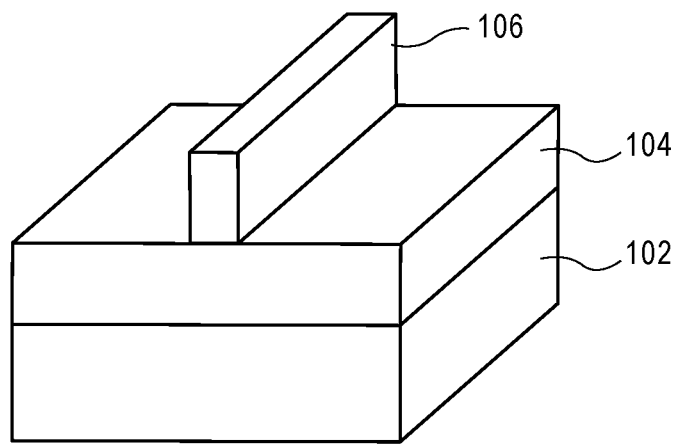
Figure 2C:
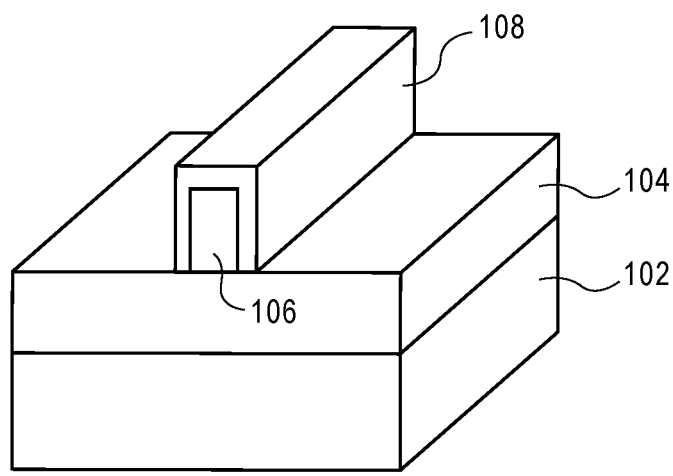

As an exemplary processing scheme, FIGS. 2A-2C illustrate angled cross-sectional views of various stages in a method of fabricating a thin film core-shell fin integrated circuit structure, in accordance with an embodiment of the present disclosure.

Referring to FIG. 2A, a starting material stack includes a first semiconducting oxide material 206 on an insulator layer 104 above a substrate 102. A masking layer or layers 210 is formed on or above the first semiconducting oxide material 206.

Referring to FIG. 2B, the pattern of the masking layer or layers 210 is patterned into the first semiconducting oxide material 206 into a fin 106. The masking layer or layers 210 is then removed.

Referring to FIG. 2C, a second semiconducting oxide material 108 is formed over the fin 106. In one embodiment, the second semiconducting oxide material 108 is conformal with the sidewalls and top of the fin 106, in that the lateral thickness of the second semiconducting oxide material 108 along the sidewalls of the fin 106 is substantially the same or is the same as the vertical thickness on the top of the fin 106. The structure of FIG. 2C may then be used as a foundation for fabricating structure 100 described in association with FIGS. 1A-1C.

Figure 3A:
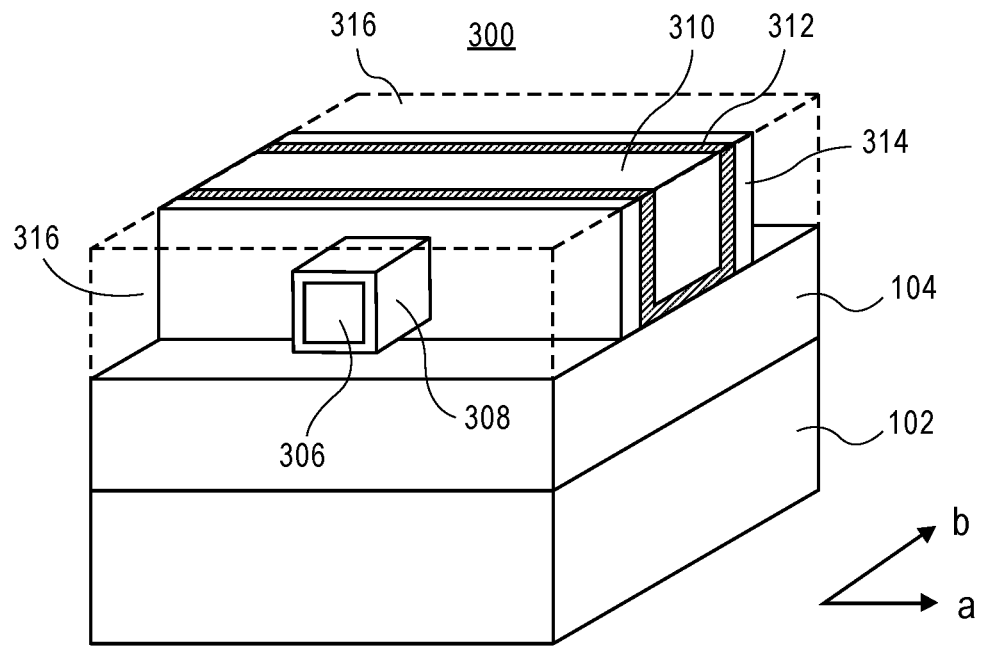
FIGS. 3A, 3B, 3C illustrate angled and direct cross-sectional views of a thin film core-shell nanowire integrated circuit structure, in accordance with an embodiment of the present disclosure.
Figure 3B:
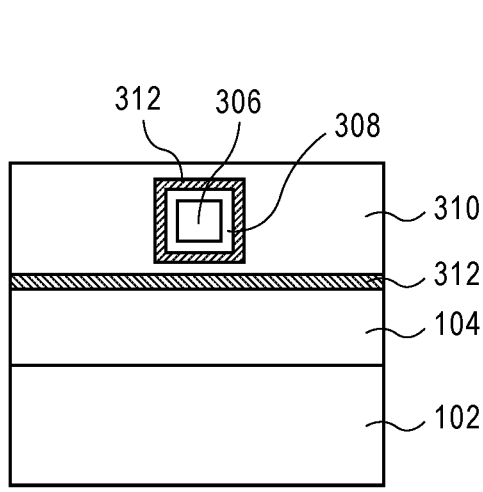
Figure 3C:
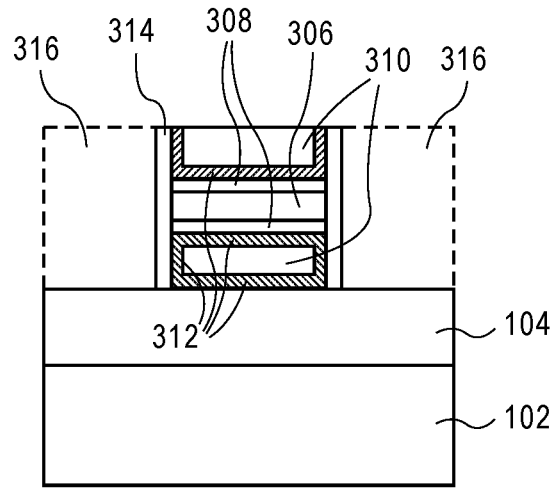

As a second exemplary core-shell structure, FIGS. 3A, 3B, 3C illustrate angled and direct cross-sectional views of a thin film core-shell nanowire integrated circuit structure, in accordance with an embodiment of the present disclosure.

Referring to FIGS. 3A-3C, an integrated circuit structure 300 includes a nanowire 306 above an insulator layer 304 above a substrate 302. The nanowire 306 has a top, a bottom and sidewalls. The nanowire 306 is composed of a first semiconducting oxide material. A second semiconducting oxide material 308 is on the top, bottom and sidewalls of the nanowire 306. A gate electrode 310 is adjacent a first portion of the second semiconducting oxide material 308 on the top, bottom and sidewalls of the nanowire 306. The gate electrode 310 has a first side opposite a second side. A first conductive contact (left 316) is adjacent the first side of the gate electrode 310, and adjacent a second portion of the second semiconducting oxide material 308 on the top, bottom and sidewalls of the nanowire 306. A second conductive contact (right 316) is adjacent the second side of the gate electrode 306, and adjacent a third portion of the second semiconducting oxide material 308 on the top, bottom and sidewalls of the nanowire 306.

In an embodiment, the nanowire 306 is sized as a wire or a ribbon, and may have squared-off or rounder corners. In one embodiment, the nanowire 306 has a wire geometry having square-like or, if corner-rounded, circular geometry in cross-sectional view. In one embodiment, the nanowire 306 has a ribbon geometry having rectangular-like or, if corner-rounded, oval-like in cross-section profile. In an embodiment, the dimensions of the nanowire 306, from a cross-sectional perspective, are on the nano-scale. For example, in a specific embodiment, the smallest dimension of the nanowire 306 is less than approximately 20 nanometers.

In an embodiment, the second semiconducting oxide material 308 has a different composition than the first semiconducting oxide material of nanowire 306. In one embodiment, the first semiconducting oxide material has a mobility greater than a mobility of the second semiconducting oxide material 308. In one embodiment, the first semiconducting oxide material includes a material such as, but not limited to, tin oxide, antimony oxide, indium oxide, indium tin oxide, titanium oxide, zinc oxide, indium zinc oxide, gallium oxide, titanium oxynitride, ruthenium oxide or tungsten oxide. In one embodiment, the second semiconducting oxide material 308 is or includes indium gallium zinc oxide (IGZO).

In an embodiment, the first and second conductive contacts 316 have a bottom surface below a bottom of the nanowire 306 and, hence, wrap around the bottom of the nanowire 306, as is depicted in FIG. 3A. In an embodiment, the integrated circuit structure 300 further includes a gate dielectric layer 312 between the gate electrode 310 and the first portion of the second semiconducting oxide material 308 on the top, bottom and sidewalls of the nanowire 306, as is depicted in FIGS. 3A-3C.

In an embodiment, the integrated circuit structure 300 further includes a first dielectric spacer (left 314) between the first conductive contact 316 and the first side of the gate electrode 310, the first dielectric spacer 314 over a fourth portion of the second semiconducting oxide material 308 on the top, bottom and sidewalls of the nanowire 306. A second dielectric spacer (right 314) is between the second conductive contact 316 and the second side of the gate electrode 310, the second dielectric spacer 314 over a fifth portion of the second semiconducting oxide material 308 on the top, bottom and sidewalls of the nanowire 306, as is depicted in FIGS. 3A and 3C. In one such embodiment, the gate dielectric layer 312 is further along the first and second dielectric spacers 314, as is also depicted in FIGS. 3A and 3C.

Figure 4A:
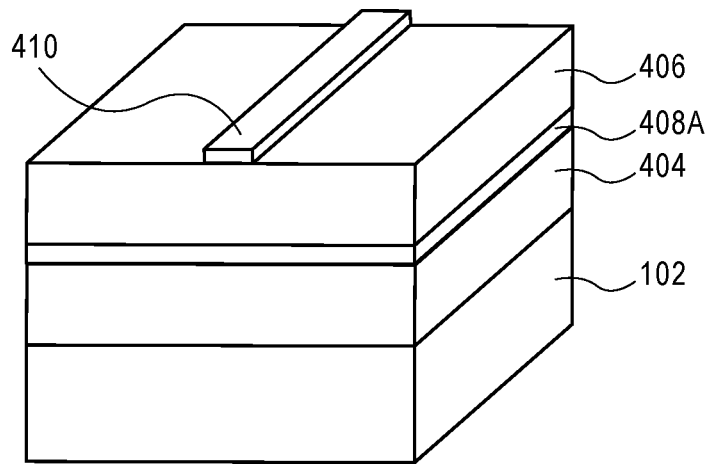
FIGS. 4A-4C illustrate angled cross-sectional views of various stages in a method of fabricating a thin film core-shell nanowire integrated circuit structure, in accordance with an embodiment of the present disclosure.
Figure 4B:
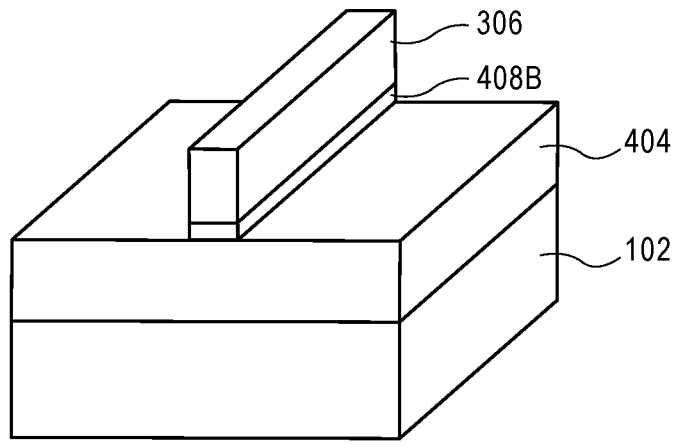
Figure 4C:
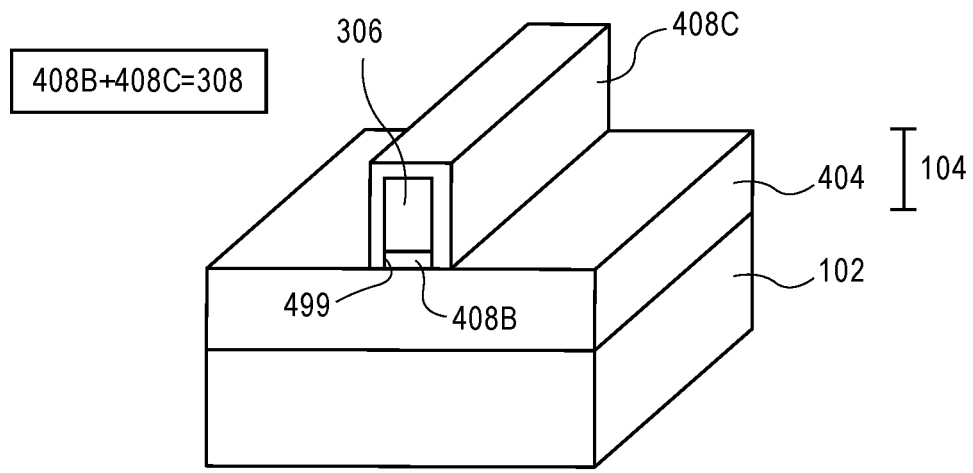

As an exemplary processing scheme, FIGS. 4A-4C illustrate angled cross-sectional views of various stages in a method of fabricating a thin film core-shell nanowire integrated circuit structure, in accordance with an embodiment of the present disclosure.

Referring to FIG. 4A, a starting material stack includes a first semiconducting oxide material 406 on a first portion 408A of a second semiconducting oxide material. The first portion 408A of the second semiconducting oxide material is on an insulator layer 404 above a substrate 102. A masking layer or layers 410 is formed on or above the first semiconducting oxide material 406.

Referring to FIG. 4B, the pattern of the masking layer or layers 410 is patterned into the first semiconducting oxide material 406 and into the first portion 408A of the second semiconducting oxide material to form a fin-type structure. The fin-type structure includes a first semiconducting oxide material nanowire 306 on a patterned first portion 408B of the second semiconducting oxide material. The masking layer or layers 410 is then removed.

Referring to FIG. 4C, a second portion 408C of the second semiconducting oxide material is formed over the fin-type structure of FIG. 4B. In one embodiment, the second portion 408C of the second semiconducting oxide material is conformal with the sidewalls and top of the fin-type structure of FIG. 4B, in that the lateral thickness of the second portion 408C of the second semiconducting oxide material along the sidewalls of the fin-type structure of FIG. 4B is substantially the same or is the same as the vertical thickness on the top of the fin-type structure of FIG. 4B. The structure of FIG. 4C may then be used as a foundation for fabricating structure 300 described in association with FIGS. 3A-3C.

Referring again to FIG. 4C, in an embodiment, a seam 499 is present where the patterned first portion 408B of the second semiconducting oxide material on the bottom of the first semiconducting oxide material nanowire 306 meets the second portion 408C of the second semiconducting oxide material on the top and sidewalls of the first semiconducting oxide material nanowire 306. In an embodiment, as indicated by the bar 104, subsequent to forming the structure of FIG. 4C, at least a portion of the insulating layer 404 is recessed to release at least a channel region of the nanowire 306 to form a gate all around structure as described in association with FIGS. 3A-3C, e.g., through use of a replacement gate process. The source and drain regions may ultimately be released as well to enable formation of contact all around structures, an example of which is also described in association with FIGS. 3A-3C.

In another aspect, the performance of a thin film transistor (TFT) may depend on the carrier mobility of the components in the TFT. For example, a material with a higher carrier mobility enables carriers to move more quickly in response to a given electric field than a material with a lower carrier mobility. Accordingly, high carrier mobilities may be associated with improved performance.

In accordance with embodiments described herein, a layer of a semiconducting oxide, such as a layer of IGZO, is between a high-k gate dielectric material and a higher mobility semiconducting oxide channel material. Although IGZO has a relatively low mobility (approximately 10 $cm^2/V \cdot s$), the sub threshold swing of IGZO may be close to the conventional theoretical lower limit. In some embodiments, a thin layer of IGZO may directly border a channel material of choice, and may be sandwiched between the channel material and the high-k dielectric. The use of IGZO at the interface between the gate stack and the channel may achieve one or more of a number of advantages. For example, an IGZO interface may have a relatively small number of interface traps, defects at which carriers are trapped and released that impede performance. A TFT that includes an IGZO layer as a second semiconducting oxide material may exhibit desirably low gate leakage. When IGZO is used as an interface to a non-IGZO semiconducting oxide channel material (e.g., a thin film oxide semiconductor material having a higher mobility than IGZO), the benefits of the higher mobility channel material may be realized simultaneously with the good gate oxide interface properties provided by the IGZO. In accordance with one or more embodiments described herein, a gate-channel arrangement based on a core-shell channel enables the use of a wider array of thin film transistor channel materials, while achieving desirable gate control, than realizable using conventional approaches.

It is to be appreciated that the layers and materials described in association with embodiments herein are typically formed on or above an underlying semiconductor substrate 102 or 302, e.g., as FEOL layer(s). In other embodiments, the layers and materials described in association with embodiments herein are typically formed on or above underlying device layer(s) of an integrated circuit, e.g., as BEOL layer(s). In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back end of line (BEOL) interconnect layers.

In the case that an insulator layer 104 or 304 is optionally used, the insulator layer 104 or 304 may be composed of a material suitable to ultimately electrically isolate, or contribute to the isolation of, portions of a gate structure from an underlying bulk substrate or interconnect layer. For example, in one embodiment, the insulator layer 104 or 304 is composed of a dielectric material such as, but not limited to, silicon dioxide, silicon oxy-nitride, silicon nitride, or carbon-doped silicon nitride. In a particular embodiment, the insulator layer 104 or 304 is a low-k dielectric layer of an underlying BEOL layer.

In an embodiment, the fin 106 or nanowire 306 and, hence, channel material of a TFT includes a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In particular, in some embodiments, a channel material having a higher carrier mobility than IGZO is used. In an embodiment, whether a nanowire or fin, the channel material has a thickness between 5 nanometers and 30 nanometers.

The use of IGZO as a second semiconducting oxide material 108 or 308, together with the use of a semiconducting oxide channel material having a higher carrier mobility than IGZO, may enable a transistor fabricated therefrom to take advantage of high quality interface properties of IGZO and high mobility of the channel material. In an embodiment, the second semiconducting oxide material 108 or 308 has a thickness between 2 nanometers and 5 nanometers. In an embodiment, an IGZO layer used as a second semiconducting oxide material 108 or 308 has a gallium to indium ratio of 1:1, a gallium to indium ratio greater than 1 (e.g., 2:1, 3:1, 4:1, 5:1, 6:1, 7:1, 8:1, 9:1, or 10:1), or a gallium to indium ratio less than 1 (e.g., 1:2, 1:3, 1:4, 1:5, 1:6, 1:7, 1:8, 1:9, or 1:10). A low indium content IGZO may refer to IGZO having more gallium than indium (e.g., with a gallium to indium ratio greater than 1:1), and may also be referred to as high gallium content IGZO. Similarly, low gallium content IGZO may refer to IGZO having more indium than gallium (e.g., with a gallium to indium ratio less than 1:1), and may also be referred to as high indium content IGZO.

In an embodiment, the second semiconducting oxide material 108 or 308 is an amorphous, crystalline, or semi crystalline oxide semiconductor, such as an amorphous, crystalline, or semi crystalline oxide semiconductor IGZO layer. The second semiconducting oxide material 108 or 308 may be formed using a low-temperature deposition process, such as physical vapor deposition (PVD) (e.g., sputtering), atomic layer deposition (ALD), or chemical vapor deposition (CVD). The ability to deposit the second semiconducting oxide material 108 or 308 at temperatures low enough to be compatible with back-end manufacturing processes represents a particular advantage. The second semiconducting oxide material 108 or 308 may be deposited on sidewalls or conformably on any desired structure to a precise thickness, allowing the manufacture of transistors having any desired geometry.

In an embodiment, gate electrode 110 or 310 includes at least one P-type work function metal or N-type work function metal, depending on whether the integrated circuit device 100 or 300 is to be included in a P-type transistor or an N-type transistor. For a P-type transistors, metals that may be used for the gate electrode 110 or 310 may include, but are not limited to, ruthenium, palladium, platinum, cobalt, nickel, and conductive metal oxides (e.g., ruthenium oxide). For an N-type transistor, metals that may be used for the gate electrode 110 or 310 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode includes a stack of two or more metal layers, where one or more metal layers are work function metal layers and at least one metal layer is a fill metal layer. Further metal layers may be included for other purposes, such as to act as a barrier layer. In some implementations, the gate electrode 110 or 310 may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, gate dielectric layer 112 or 312 is composed of a high-K material. For example, in one embodiment, the gate dielectric layer 112 or 312 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In some implementations, the gate dielectric 112 or 312 may consist of a "U"-shaped structure that includes a bottom portion substantially parallel to the surface of the substrate and two sidewall portions that are substantially perpendicular to the top surface of the substrate, as is depicted in FIGS. 1A and 3A.

In some embodiments, the second semiconducting oxide material 108 or 308 is in contact with the gate dielectric layer 112 or 312, respectively, an arrangement which may put an IGZO layer in contact with a high-k metal oxide layer. In other embodiments, an intermediate material is disposed between the second semiconducting oxide material 108 or 308 and the gate dielectric layer 112 or 312. In some embodiments, an IGZO layer includes multiple regions of IGZO having different material properties. For example, an IGZO layer may include low indium content IGZO close to (e.g., in contact with) a high-k gate dielectric layer, and a high indium content IGZO close to (e.g., in contact with) the higher mobility semiconducting oxide channel material. High indium content IGZO may provide higher mobility and poorer interface properties relative to low indium content IGZO, while low indium content IGZO may provide a wider band gap, lower gate leakage, and better interface properties, although a lower mobility, relative to high indium content IGZO.

In an embodiment, dielectric spacers 114 or 314 are formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used. For example, two pairs, three pairs, or four pairs of sidewall spacers may be formed on opposing sides of the gate electrode 110 or 310.

In an embodiment, conductive contacts 116 act as contacts to source/drain regions of the fin or nanowire, or act directly as source/drain regions. The conductive contacts 116 may be spaced apart by a distance that is the gate length of the transistor 100 or 300. In some embodiments, the gate length is between 7 and 30 nanometers. In an embodiment, the conductive contacts 116 include one or more layers of metal and/or metal alloys. In a particular embodiment, the conductive contacts 116 are composed of aluminum or an aluminum-containing alloy.

The integrated circuit structures described herein may be included in an electronic device. As a first example of an apparatus that may include one or more of the TFTs disclosed herein, FIGS. 5A and 5B are top views of a wafer and dies that include one or more thin film core-shell fin or nanowire transistors, in accordance with any of the embodiments disclosed herein.

Figure 5B:
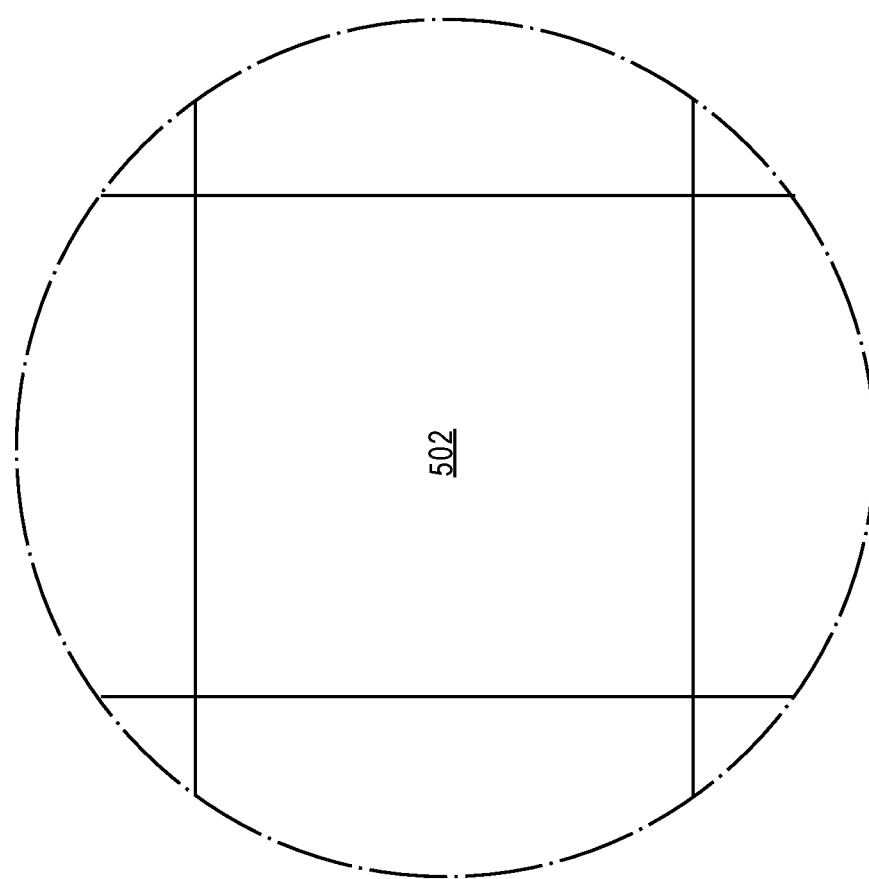
FIGS. 5A and 5B are top views of a wafer and dies that include one or more thin film core-shell fin or nanowire transistors, in accordance with one or more of the embodiments disclosed herein.
Figure 5A:
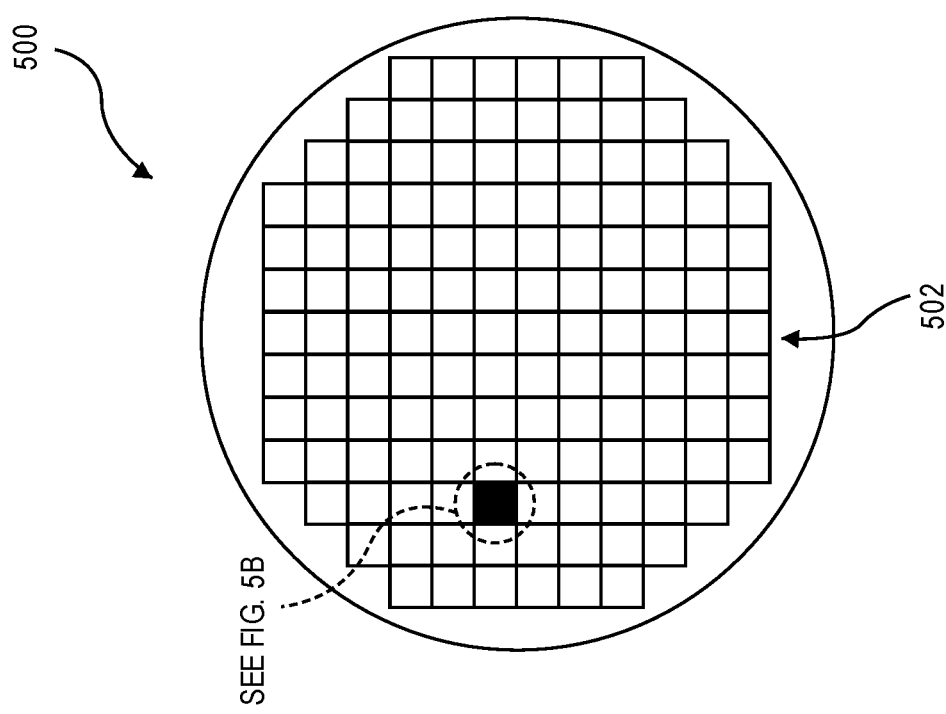

Referring to FIGS. 5A and 5B, a wafer 500 may be composed of semiconductor material and may include one or more dies 502 having integrated circuit (IC) structures formed on a surface of the wafer 500. Each of the dies 502 may be a repeating unit of a semiconductor product that includes any suitable IC (e.g., ICs including one or more structures such as structures 100 or 300). After the fabrication of the semiconductor product is complete (e.g., after manufacture of structures 100 or 300), the wafer 500 may undergo a singulation process in which each of the dies 502 is separated from one another to provide discrete "chips" of the semiconductor product. In particular, devices that include TFT as disclosed herein may take the form of the wafer 500 (e.g., not singulated) or the form of the die 502 (e.g., singulated). The die 502 may include one or more transistors and/or supporting circuitry to route electrical signals to the transistors, as well as any other IC components. In some embodiments, the wafer 500 or the die 502 may include a memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Figure 6:
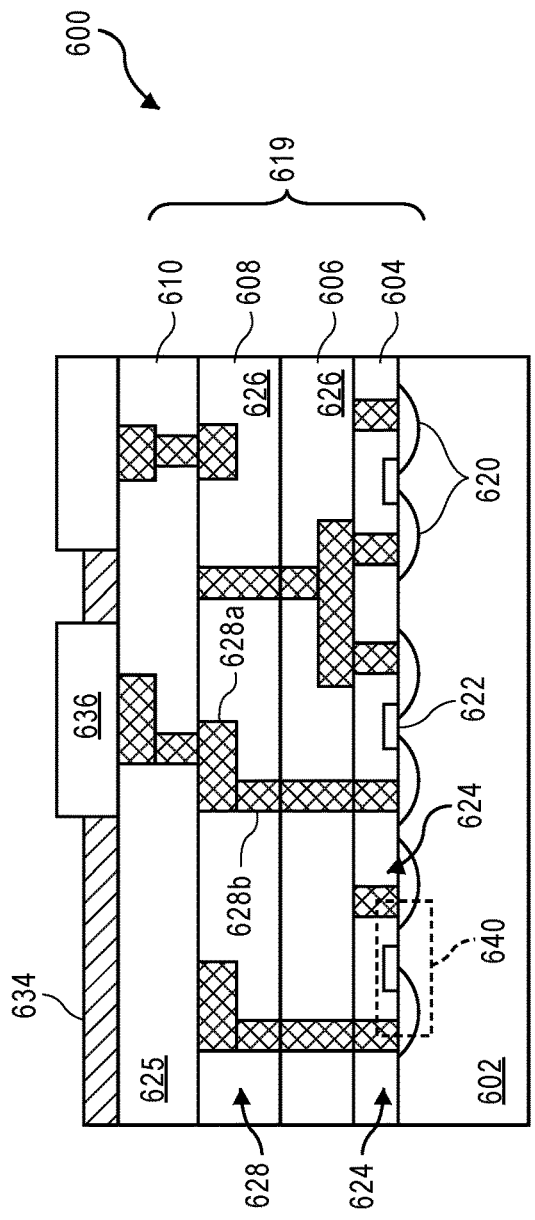
FIG. 6 is a cross-sectional side view of an integrated circuit (IC) device that may include one or more thin film core-shell fin or nanowire transistors, in accordance with one or more of the embodiments disclosed herein.

FIG. 6 is a cross-sectional side view of an integrated circuit (IC) device that may include one or more thin film core-shell fin or nanowire transistors, in accordance with one or more of the embodiments disclosed herein.

Referring to FIG. 6, an IC device 600 is formed on a substrate 602 (e.g., the wafer 500 of FIG. 5A) and may be included in a die (e.g., the die 502 of FIG. 5B), which may be singulated or included in a wafer. Although a few examples of materials from which the substrate 602 may be formed are described above in association with substrate 100 or 300, any material that may serve as a foundation for an IC device 600 may be used.

The IC device 600 may include one or more device layers, such as device layer 604, disposed on the substrate 602. The device layer 604 may include features of one or more transistors 640 (e.g., TFTs described above) formed on the substrate 602. The device layer 604 may include, for example, one or more source and/or drain (S/D) regions 620, a gate 622 to control current flow in the transistors 640 between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include Fin-based transistors, such as double-gate transistors or tri-gate transistors, and wrap-around or all-around gate transistors, such as nanoribbon and nanowire transistors. In particular, one or more of the transistors 640 take the form of the transistors 100 or 300. Thin-film transistors such as 100 or 300 may be particularly advantageous when used in the metal layers of a microprocessor device for analog circuitry, logic circuitry, or memory circuitry, and may be formed along with existing complementary metal oxide semiconductor (CMOS) processes.

Electrical signals, such as power and/or input/output (I/O) signals, may be routed to and/or from the transistors 640 of the device layer 604 through one or more interconnect layers disposed on the device layer 604 (illustrated in FIG. 6 as interconnect layers 606-610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form an interlayer dielectric (ILD) stack 619 of the IC device 600.

The interconnect structures 628 may be arranged within the interconnect layers 606-610 to route electrical signals according to a wide variety of designs (in particular, the arrangement is not limited to the particular configuration of interconnect structures 628 depicted in FIG. 6). Although a particular number of interconnect layers 606-610 is depicted in FIG. 6, embodiments of the present disclosure include IC devices having more or fewer interconnect layers than depicted.

In some embodiments, the interconnect structures 628 may include trench structures 628a (sometimes referred to as "lines") and/or via structures 628b filled with an electrically conductive material such as a metal. The trench structures 628a may be arranged to route electrical signals in a direction of a plane that is substantially parallel with a surface of the substrate 602 upon which the device layer 604 is formed. For example, the trench structures 628a may route electrical signals in a direction in and out of the page from the perspective of FIG. 6. The via structures 628b may be arranged to route electrical signals in a direction of a plane that is substantially perpendicular to the surface of the substrate 602 upon which the device layer 604 is formed. In some embodiments, the via structures 628b may electrically couple trench structures 628a of different interconnect layers 606-610 together.

The interconnect layers 606-610 may include a dielectric material 626 disposed between the interconnect structures 628, as shown in FIG. 6. In some embodiments, the dielectric material 626 disposed between the interconnect structures 628 in different ones of the interconnect layers 606-610 may have different compositions; in other embodiments, the composition of the dielectric material 626 between different interconnect layers 606-610 may be the same. In either case, such dielectric materials may be referred to as inter-layer dielectric (ILD) materials.

A first interconnect layer 606 (referred to as Metal 1 or "M1") may be formed directly on the device layer 604. In some embodiments, the first interconnect layer 606 may include trench structures 628a and/or via structures 628b, as shown. The trench structures 628a of the first interconnect layer 606 may be coupled with contacts (e.g., the S/D contacts 624) of the device layer 604.

A second interconnect layer 608 (referred to as Metal 2 or "M2") may be formed directly on the first interconnect layer 606. In some embodiments, the second interconnect layer 608 may include via structures 628b to couple the trench structures 628a of the second interconnect layer 608 with the trench structures 628a of the first interconnect layer 606. Although the trench structures 628a and the via structures 628b are structurally delineated with a line within each interconnect layer (e.g., within the second interconnect layer 608) for the sake of clarity, the trench structures 628a and the via structures 628b may be structurally and/or materially contiguous (e.g., simultaneously filled during a dual-damascene process) in some embodiments.

A third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606.

The IC device 600 may include a solder resist material 634 (e.g., polyimide or similar material) and one or more bond pads 636 formed on the interconnect layers 606-610. The bond pads 636 may be electrically coupled with the interconnect structures 628 and configured to route the electrical signals of the transistor(s) 640 to other external devices. For example, solder bonds may be formed on the one or more bond pads 636 to mechanically and/or electrically couple a chip including the IC device 600 with another component (e.g., a circuit board). The IC device 600 may have other alternative configurations to route the electrical signals from the interconnect layers 606-610 than depicted in other embodiments. For example, the bond pads 636 may be replaced by or may further include other analogous features (e.g., posts) that route the electrical signals to external components.

Figure 7:
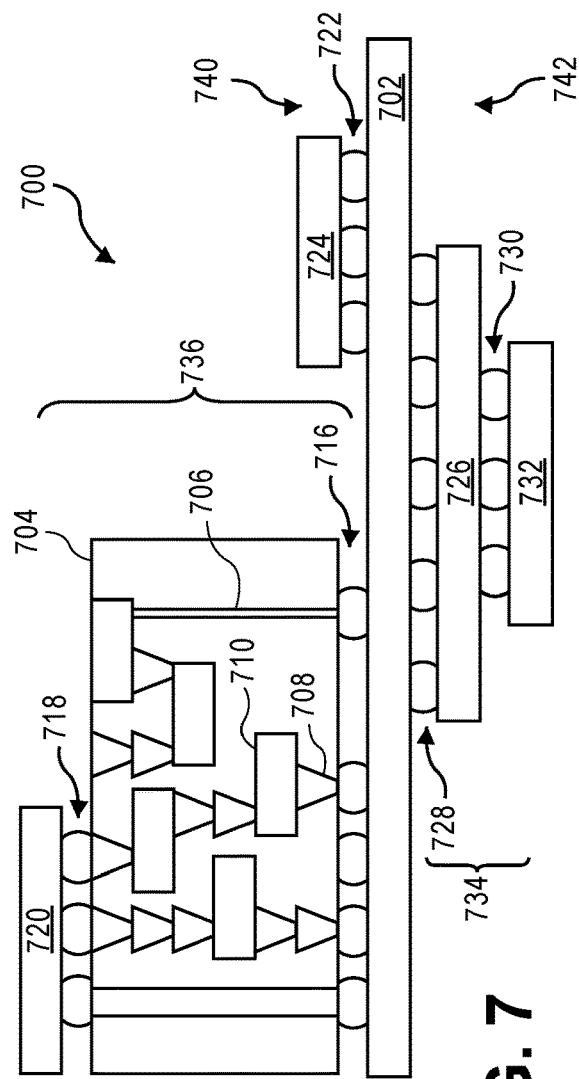
FIG. 7 is a cross-sectional side view of an integrated circuit (IC) device assembly that may include one or more thin film core-shell fin or nanowire transistors, in accordance with one or more of the embodiments disclosed herein.

FIG. 7 is a cross-sectional side view of an integrated circuit (IC) device assembly that may include one or more thin film core-shell fin or nanowire transistors, in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of the TFT structures 100 or 300 disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 502 of FIG. 5B), an IC device (e.g., the IC device 600 of FIG. 6), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

In an embodiment, interconnect lines (and, possibly, underlying via structures) described herein are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Interconnect lines described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, ILD materials described herein are composed of or include a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In one aspect, a gate electrode and gate dielectric layer, e.g., gate electrode 110/310 and gate dielectric layer 112/312 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structures described herein. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed. The anneal is performed prior to formation of the permanent contacts.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
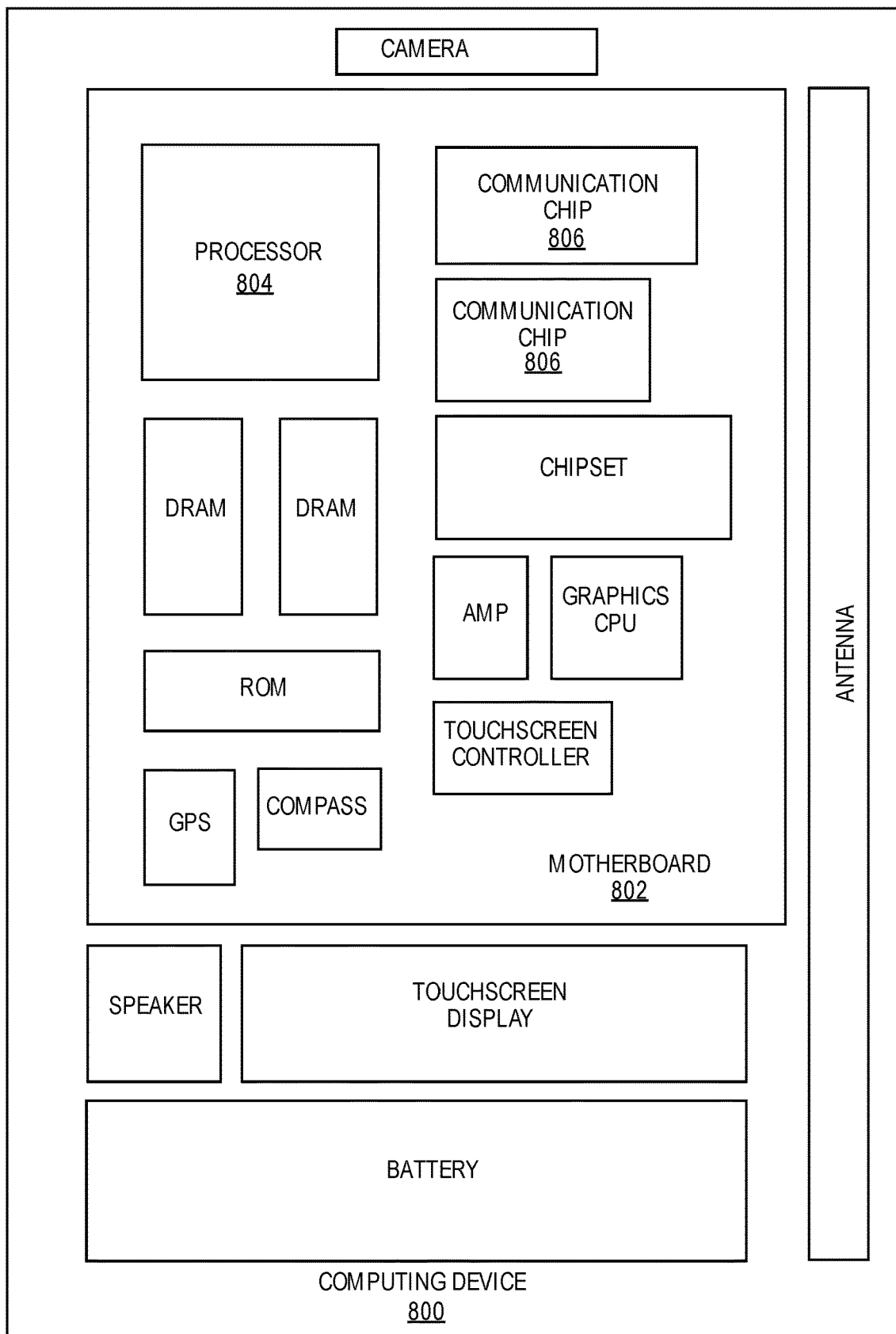
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more thin film core-shell fin or nanowire transistors, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more thin film core-shell fin or nanowire transistors, in accordance with implementations of embodiments of the disclosure.

In further implementations, another component housed within the computing device 800 may contain an integrated circuit die that includes one or more thin film core-shell fin or nanowire transistors, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments described herein include thin film core-shell fin or nanowire transistors.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a fin on an insulator layer above a substrate. The fin has a top and sidewalls. The fin is composed of a first semiconducting oxide material. A second semiconducting oxide material is on the top and sidewalls of the fin. The second semiconducting oxide material has a different composition than the first semiconducting oxide material. A gate electrode is over a first portion of the second semiconducting oxide material on the top and sidewalls of the fin. The gate electrode has a first side opposite a second side. A first conductive contact is adjacent the first side of the gate electrode, the first conductive contact over a second portion of the second semiconducting oxide material on the top and sidewalls of the fin. A second conductive contact is adjacent the second side of the gate electrode, the second conductive contact over a third portion of the second semiconducting oxide material on the top and sidewalls of the fin.

Example Embodiment 2

The integrated circuit structure of example embodiment 1, wherein the first and second conductive contacts have a bottom surface substantially co-planar with a bottom of the fin.

Example Embodiment 3

The integrated circuit structure of example embodiment 1 or 2, wherein the first semiconducting oxide material has a mobility greater than a mobility of the second semiconducting oxide material.

Example Embodiment 4

The integrated circuit structure of example embodiment 1, 2 or 3, wherein the first semiconducting oxide material includes a material selected from the group consisting of tin oxide, antimony oxide, indium oxide, indium tin oxide, titanium oxide, zinc oxide, indium zinc oxide, gallium oxide, titanium oxynitride, ruthenium oxide and tungsten oxide.

Example Embodiment 5

The integrated circuit structure of example embodiment 1, 2, 3 or 4, wherein the second semiconducting oxide material is indium gallium zinc oxide.

Example Embodiment 6

The integrated circuit structure of example embodiment 1, 2, 3, 4 or 5, further including a gate dielectric layer between the gate electrode and the first portion of the second semiconducting oxide material on the top and sidewalls of the fin.

Example Embodiment 7

The integrated circuit structure of example embodiment 1, 2, 3, 4, 5 or 6, further including a first dielectric spacer between the first conductive contact and the first side of the gate electrode, the first dielectric spacer over a fourth portion of the second semiconducting oxide material on the top and sidewalls of the fin, and a second dielectric spacer between the second conductive contact and the second side of the gate electrode, the second dielectric spacer over a fifth portion of the second semiconducting oxide material on the top and sidewalls of the fin.

Example Embodiment 8

The integrated circuit structure of example embodiment 7, further including a gate dielectric layer between the gate electrode and the first portion of the second semiconducting oxide material on the top and sidewalls of the fin, wherein the gate dielectric layer is further along the first dielectric spacer and the second dielectric spacer.

Example Embodiment 9

An integrated circuit structure includes a fin on an insulator layer above a substrate. The fin has a top and sidewalls, and the fin is composed of a first semiconducting oxide material. A second semiconducting oxide material is on at least a portion of the top and sidewalls of the fin, the second semiconducting oxide material having a different composition than the first semiconducting oxide material. A gate electrode is over the second semiconducting oxide material on the portion of the top and sidewalls of the fin, the gate electrode having a first side opposite a second side. A first conductive contact is adjacent the first side of the gate electrode, the first conductive contact over a second portion of the top and sidewalls of the fin. A second conductive contact is adjacent the second side of the gate electrode, the second conductive contact over a third portion of the top and sidewalls of the fin. The first and second conductive contacts have a bottom surface substantially co-planar with a bottom of the fin.

Example Embodiment 10

The integrated circuit structure of example embodiment 9, wherein the first semiconducting oxide material has a mobility greater than a mobility of the second semiconducting oxide material.

Example Embodiment 11

The integrated circuit structure of example embodiment 9 or 10, wherein the first semiconducting oxide material includes a material selected from the group consisting of tin oxide, antimony oxide, indium oxide, indium tin oxide, titanium oxide, zinc oxide, indium zinc oxide, gallium oxide, titanium oxynitride, ruthenium oxide and tungsten oxide.

Example Embodiment 12

The integrated circuit structure of example embodiment 9, 10 or 11, wherein the second semiconducting oxide material is indium gallium zinc oxide.

Example Embodiment 13

The integrated circuit structure of example embodiment 9, 10, 11 or 12, further including a gate dielectric layer between the gate electrode and the portion of the top and sidewalls of the fin.

Example Embodiment 14

The integrated circuit structure of example embodiment 9, 10, 11, 12 or 13, further including a first dielectric spacer between the first conductive contact and the first side of the gate electrode, the first dielectric spacer over a fourth portion of the top and sidewalls of the fin, and a second dielectric spacer between the second conductive contact and the second side of the gate electrode, the second dielectric spacer over a fifth portion of the top and sidewalls of the fin.

Example Embodiment 15

The integrated circuit structure of example embodiment 14, further including a gate dielectric layer between the gate electrode and the portion of the top and sidewalls of the fin, wherein the gate dielectric layer is further along the first dielectric spacer and the second dielectric spacer.

Example Embodiment 16

An integrated circuit structure includes a nanowire above an insulator layer above a substrate. The nanowire has a top, a bottom and sidewalls. The nanowire is composed of a first semiconducting oxide material. A second semiconducting oxide material is on the top, bottom and sidewalls of the nanowire. The second semiconducting oxide material has a different composition than the first semiconducting oxide material. A gate electrode is adjacent a first portion of the second semiconducting oxide material on the top, bottom and sidewalls of the nanowire. The gate electrode has a first side opposite a second side. A first conductive contact is adjacent the first side of the gate electrode, the first conductive contact adjacent a second portion of the second semiconducting oxide material on the top, bottom and sidewalls of the nanowire. A second conductive contact is adjacent the second side of the gate electrode, the second conductive contact adjacent a third portion of the second semiconducting oxide material on the top, bottom and sidewalls of the nanowire.

Example Embodiment 17

The integrated circuit structure of example embodiment 16, further including a seam between the second semiconducting oxide material on the sidewalls of the nanowire and the second semiconducting oxide material on the bottom of the nanowire.

Example Embodiment 18

The integrated circuit structure of example embodiment 16 or 17, wherein the first and second conductive contacts have a bottom surface below a bottom of the nanowire.

Example Embodiment 19

The integrated circuit structure of example embodiment 16, 17 or 18, wherein the first semiconducting oxide material has a mobility greater than a mobility of the second semiconducting oxide material.

Example Embodiment 20

The integrated circuit structure of example embodiment 16, 17, 18 or 19, wherein the first semiconducting oxide material includes a material selected from the group consisting of tin oxide, antimony oxide, indium oxide, indium tin oxide, titanium oxide, zinc oxide, indium zinc oxide, gallium oxide, titanium oxynitride, ruthenium oxide and tungsten oxide.

Example Embodiment 21

The integrated circuit structure of example embodiment 16, 17, 18, 19 or 20, wherein the second semiconducting oxide material is indium gallium zinc oxide.

Example Embodiment 22

The integrated circuit structure of example embodiment 16, 17, 18, 19, 20 or 21, further including a gate dielectric layer between the gate electrode and the first portion of the second semiconducting oxide material on the top, bottom and sidewalls of the nanowire.

Example Embodiment 23

The integrated circuit structure of example embodiment 16, 17, 18, 19, 20, 21 or 22, further including a first dielectric spacer between the first conductive contact and the first side of the gate electrode, the first dielectric spacer over a fourth portion of the second semiconducting oxide material on the top, bottom and sidewalls of the nanowire, and a second dielectric spacer between the second conductive contact and the second side of the gate electrode, the second dielectric spacer over a fifth portion of the second semiconducting oxide material on the top, bottom and sidewalls of the nanowire.

Example Embodiment 24

The integrated circuit structure of example embodiment 23, further including a gate dielectric layer between the gate electrode and the first portion of the second semiconducting oxide material on the top and sidewalls of the nanowire, wherein the gate dielectric layer is further along the first dielectric spacer and the second dielectric spacer.

What is claimed is:
1. An integrated circuit structure, comprising:
a fin on an insulator layer above a substrate, the fin having a top and sidewalls, and the fin comprising a first semiconducting oxide material directly on the insulator layer, the first semiconducting oxide material having a bottommost surface;

a second semiconducting oxide material on the top and sidewalls of the first semiconducting oxide material of the fin, the second semiconducting oxide material having a different composition than the first semiconducting oxide material, and the second semiconducting oxide material having a bottommost surface co-planar with the bottommost surface of the first semiconducting oxide material;

a gate electrode over a first portion of the second semiconducting oxide material on the top and sidewalls of the fin, the gate electrode having a first side opposite a second side;

a first conductive contact adjacent the first side of the gate electrode, the first conductive contact over a second portion of the second semiconducting oxide material on the top and sidewalls of the fin; and a second conductive contact adjacent the second side of the gate electrode, the second conductive contact over a third portion of the second semiconducting oxide material on the top and sidewalls of the fin.

2. The integrated circuit structure of claim 1, wherein the first and second conductive contacts have a bottom surface substantially co-planar with a bottom of the fin.

3. The integrated circuit structure of claim 1, wherein the first semiconducting oxide material has a mobility greater than a mobility of the second semiconducting oxide material.

4. The integrated circuit structure of claim 1, wherein the first semiconducting oxide material comprises a material selected from a group consisting of tin oxide, antimony oxide, indium oxide, indium tin oxide, titanium oxide, zinc oxide, indium zinc oxide, gallium oxide, titanium oxynitride, ruthenium oxide and tungsten oxide.

5. The integrated circuit structure of claim 4, wherein the second semiconducting oxide material comprises indium gallium zinc oxide.

6. The integrated circuit structure of claim 1, further comprising: a gate dielectric layer between the gate electrode and the first portion of the second semiconducting oxide material on the top and sidewalls of the fin.

7. The integrated circuit structure of claim 1, further comprising:
a first dielectric spacer between the first conductive contact and the first side of the gate electrode, the first dielectric spacer over a fourth portion of the second semiconducting oxide material on the top and sidewalls of the fin; and
a second dielectric spacer between the second conductive contact and the second side of the gate electrode, the second dielectric spacer over a fifth portion of the second semiconducting oxide material on the top and sidewalls of the fin.

8. The integrated circuit structure of claim 7, further comprising:
a gate dielectric layer between the gate electrode and the first portion of the second semiconducting oxide material on the top and sidewalls of the fin, wherein the gate dielectric layer is along the first dielectric spacer and the second dielectric spacer.

9. An integrated circuit structure, comprising:
a fin on an insulator layer above a substrate, the fin having a top and sidewalls, and the fin comprising a first semiconducting oxide material directly on the insulator layer, the first semiconducting oxide material having a bottommost surface;

a second semiconducting oxide material on at least a portion of the top and sidewalls of the first semiconducting oxide material of the fin, the second semiconducting oxide material having a different composition than the first semiconducting oxide material, and the second semiconducting oxide material having a bottommost surface co-planar with the bottommost surface of the first semiconducting oxide material;

a gate electrode over the second semiconducting oxide material on the portion of the top and sidewalls of the fin, the gate electrode having a first side opposite a second side;

a first conductive contact adjacent the first side of the gate electrode, the first conductive contact over a second portion of the top and sidewalls of the fin; and a second conductive contact adjacent the second side of the gate electrode, the second conductive contact over a third portion of the top and sidewalls of the fin, wherein the first and second conductive contacts have a bottom surface substantially co-planar with a bottom of the fin.

10. The integrated circuit structure of claim 9, wherein the first semiconducting oxide material has a mobility greater than a mobility of the second semiconducting oxide material.

11. The integrated circuit structure of claim 9, wherein the first semiconducting oxide material comprises a material selected from a group consisting of tin oxide, antimony oxide, indium oxide, indium tin oxide, titanium oxide, zinc oxide, indium zinc oxide, gallium oxide, titanium oxynitride, ruthenium oxide and tungsten oxide.

12. The integrated circuit structure of claim 11, wherein the second semiconducting oxide material comprises indium gallium zinc oxide.

13. The integrated circuit structure of claim 9, further comprising:
a gate dielectric layer between the gate electrode and the portion of the top and sidewalls of the fin.

14. The integrated circuit structure of claim 9, further comprising:
a first dielectric spacer between the first conductive contact and the first side of the gate electrode, the first dielectric spacer over a fourth portion of the top and sidewalls of the fin; and
a second dielectric spacer between the second conductive contact and the second side of the gate electrode, the second dielectric spacer over a fifth portion of the top and sidewalls of the fin.

15. The integrated circuit structure of claim 14, further comprising:
a gate dielectric layer between the gate electrode and the portion of the top and sidewalls of the fin, wherein the gate dielectric layer is along the first dielectric spacer and the second dielectric spacer.

16. An integrated circuit structure, comprising:
a nanowire above an insulator layer above a substrate, the nanowire having a top, a bottom and sidewalls, and the nanowire comprising a first semiconducting oxide material;
a second semiconducting oxide material directly on the top, bottom and sidewalls of the first semiconducting oxide material of the nanowire, the second semiconducting oxide material having a different composition than the first semiconducting oxide material;

a gate electrode adjacent a first portion of the second semiconducting oxide material on the top, bottom and sidewalls of the nanowire, the gate electrode having a first side opposite a second side;

a first conductive contact adjacent the first side of the gate electrode, the first conductive contact over a second portion of the second semiconducting oxide material on the top, bottom and sidewalls of the nanowire; and a second conductive contact adjacent the second side of the gate electrode, the second conductive contact over a third portion of the second semiconducting oxide material on the top, bottom and sidewalls of the nanowire.

17. The integrated circuit structure of claim 16, further comprising:

a seam between the second semiconducting oxide material on the sidewalls of the nanowire and the second semiconducting oxide material on the bottom of the nanowire.

18. The integrated circuit structure of claim 16, wherein the first and second conductive contacts have a bottom surface below a bottom of the nanowire.

19. The integrated circuit structure of claim 16, wherein the first semiconducting oxide material has a mobility greater than a mobility of the second semiconducting oxide material.

20. The integrated circuit structure of claim 16, wherein the first semiconducting oxide material comprises a material selected from a group consisting of tin oxide, antimony oxide, indium oxide, indium tin oxide, titanium oxide, zinc oxide, indium zinc oxide, gallium oxide, titanium oxynitride, ruthenium oxide and tungsten oxide.

21. The integrated circuit structure of claim 20, wherein the second semiconducting oxide material comprises indium gallium zinc oxide.

22. The integrated circuit structure of claim 16, further comprising:

a gate dielectric layer between the gate electrode and the first portion of the second semiconducting oxide material on the top, bottom and sidewalls of the nanowire.

23. The integrated circuit structure of claim 16, further comprising:

a first dielectric spacer between the first conductive contact and the first side of the gate electrode, the first dielectric spacer over a fourth portion of the second semiconducting oxide material on the top, bottom and sidewalls of the nanowire; and a second dielectric spacer between the second conductive contact and the second side of the gate electrode, the second dielectric spacer over a fifth portion of the second semiconducting oxide material on the top, bottom and sidewalls of the nanowire.

24. The integrated circuit structure of claim 23, further comprising:

a gate dielectric layer between the gate electrode and the first portion of the second semiconducting oxide material on the top and sidewalls of the nanowire, wherein the gate dielectric layer is along the first dielectric spacer and the second dielectric spacer.

* * * * *